United States Patent
Agata et al.

(10) Patent No.: US 9,900,045 B2
(45) Date of Patent: *Feb. 20, 2018

(54) BASE STATION SYSTEM AND COMMUNICATION APPARATUS

(71) Applicant: KDDI CORPORATION, Tokyo (JP)

(72) Inventors: Akira Agata, Saitama (JP); Shinobu Nanba, Saitama (JP)

(73) Assignee: KDDI CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/455,407

(22) Filed: Mar. 10, 2017

(65) Prior Publication Data

US 2017/0187417 A1    Jun. 29, 2017

Related U.S. Application Data

(63) Continuation of application No. 14/951,776, filed on Nov. 25, 2015, now Pat. No. 9,628,139, which is a
(Continued)

(51) Int. Cl.
*H04W 72/04* (2009.01)
*H04B 1/66* (2006.01)
*H04W 88/08* (2009.01)

(52) U.S. Cl.
CPC ............ *H04B 1/66* (2013.01); *H04W 72/042* (2013.01); *H04W 72/0453* (2013.01); *H04W 88/08* (2013.01)

(58) Field of Classification Search
CPC . H04W 16/26; H04W 88/08; H04W 72/0453; H04W 16/24; H04B 1/662;
(Continued)

(56) References Cited

U.S. PATENT DOCUMENTS 6,449,596 B1 * 9/2002 Ejima .............. G11B 20/00007
704/501
6,842,623 B2 * 1/2005 Koscal .................. H04W 24/00
455/462
(Continued)

FOREIGN PATENT DOCUMENTS

JP      S60-106228 A      6/1985
JP      2001-339449 A    12/2001
(Continued)

OTHER PUBLICATIONS

International Search Report dated Jun. 25, 2013 for PCT/JP2013/003392 and English translation of the same. (4 pages).
(Continued)

*Primary Examiner* — Afsar M Qureshi
(74) *Attorney, Agent, or Firm* — Fitch Even Tabin & Flannery LLP (57) ABSTRACT

A base station system according to an aspect of the invention includes a baseband unit (BBU) and a radio frequency (RF) unit (RFU) connected to the BBU via a communication line. The RFU (BBU) measures the frequencies of occurrence of sampled values indicated by sampled data that is a digital signal corresponding to a baseband signal to be transmitted to the BBU (RFU), and generates a frequency distribution representing a relationship between the sampled value having occurred and the frequency of occurrence. Furthermore, the RFU (BBU) determines a plurality of thresholds for compressing the sampled data, which are used for quantization processing of the sampled value, in accordance with the generated frequency distribution, and compresses the sampled data by the quantization processing using the plurality of thresholds.

14 Claims, 10 Drawing Sheets

Related U.S. Application Data continuation of application No. PCT/JP2013/003392, filed on May 29, 2013.

(58) Field of Classification Search
CPC ........ H04B 1/665; H04B 1/1081; H04B 1/38; H04B 1/18523; H04L 1/1812; H04L 1/1854; H04L 27/2332; H04L 27/2634; H04L 65/601; H04L 65/607; H04L 65/42; H04N 19/61; H04N 19/895; H04N 21/418
USPC .................................. 370/329; 375/140–240
See application file for complete search history.

(56) References Cited

U.S. PATENT DOCUMENTS

| | | | |
|---|---|---|---|
| 7,123,659 B2 | 10/2006 | Orihashi et al. | |
| 7,403,581 B2 | 7/2008 | Orihashi et al. | |
| 9,628,139 B2* | 4/2017 | Agata ..................... | H04B 1/662 |
| 2605/0104753 | 5/2005 | Dror et al. | |
| 2007/0054621 A1 | 3/2007 | Larsson | |
| 2007/0116046 A1* | 5/2007 | Liu ....................... | H04J 3/1617 370/466 |
| 2007/0149135 A1* | 6/2007 | Larsson ................. | H04B 7/022 455/67.13 |
| 2007/0177552 A1* | 8/2007 | Wu ....................... | H04W 88/08 370/335 |
| 2009/0265744 A1 | 10/2009 | Singh et al. | |
| 2009/0290632 A1 | 11/2009 | Wegener | |
| 2011/0135013 A1* | 6/2011 | Wegener ................. | H03M 7/40 375/241 |
| 2014/0328423 A1* | 11/2014 | Agee ..................... | H04B 7/0413 375/267 |

FOREIGN PATENT DOCUMENTS

| | | |
|---|---|---|
| JP | 2011-526095 A | 9/2011 |
| KR | 10-0738109 B1 | 7/2007 |
| KR | 10-2011-0030474 A | 3/2011 |
| WO | 2005/064975 A1 | 7/2005 |
| WO | 2007/114546 A1 | 10/2007 |
| WO | 2009/151893 A2 | 12/2009 |

OTHER PUBLICATIONS

CPRI Specification V5.0, Sep. 21, 2011; URL: http://www.cpri.info/downloads/CPRI_v_5_0_2011-09-21.pdf.
Office Action dated Dec. 8, 2016 for Korean Patent Application No. 10-2015-7035303. (4 pages).
Extend European Search Report dated Feb. 22, 2017 for European Patent Application No. 13885810.5. (8 pages).
Bin Guo et al.; "CPRI compression transport for LTE and LTE-A signal in C-RAN"; Aug. 8, 2012; pp. 843-849.
Dragan Samardzija et al.; "Compressed Transport of Baseband Signals in Radio Access Networks"; Sep. 1, 2012; pp. 3216-3225.
KDDI R&D Laboratories Inc.; "IQ data compression for future cellular networks"; Jul. 26, 2012; pp. 1-5.
Japanese Office Action dated May 22, 2017, issued in corresponding Japanese Patent Application No. 2016-147736 and English translation. (11 pages).

* cited by examiner

| AMPLITUDE (DECIMAL NUMBER) | OUTPUT OF ADC (N = 6) | OUTPUT OF CODER (M = 3) |
|---|---|---|
| 31 | 011111 | 011 |
| ⋮ | ⋮ | |
| 15 | 001111 | |
| 14 | 001110 | 010 |
| ⋮ | ⋮ | |
| 5 | 000101 | |
| 4 | 000100 | 001 |
| ⋮ | ⋮ | |
| 2 | 000010 | |
| 1 | 000001 | 000 |
| 0 | 000000 | |
| -1 | 111111 | 111 |
| -2 | 111110 | |
| -3 | 111101 | 110 |
| ⋮ | ⋮ | |
| -5 | 111011 | |
| -6 | 111010 | 101 |
| ⋮ | ⋮ | |
| -15 | 110001 | |
| -16 | 110000 | 100 |
| ⋮ | ⋮ | |
| -32 | 100000 | |

BASE STATION SYSTEM AND COMMUNICATION APPARATUS

CROSS-REFERENCE TO RELATED APPLICATIONS

This application is a continuation of prior U.S. application Ser. No. 14/951,776, filed Nov. 25, 2015,now U.S. Pat. No. 9,628,139, issued on Apr. 18, 2017, which is a continuation of International Patent Application No. PCT/JP2013/003392 filed on May 29, 2013, which are all hereby incorporated herein by reference in their entirety.

TECHNICAL FIELD

The present invention relates to a base station system and a communication apparatus and, more particularly, to processing of compressing and decompressing a baseband signal transmitted via a communication line between a baseband unit and a radio frequency unit in the base station system.

BACKGROUND ART

A base station installed in a radio access network is generally formed from a baseband unit (BBU) for executing baseband processing and the like and an radio frequency (RF) unit (RFU) for executing RF processing and the like. An arrangement in which a BBU is integrated with an RFU is known as the arrangement of such a base station.

To the contrary, in recent years, in a radio access network such as LTE (Long Term Evolution), a base station (base station system) in which it is possible to install a BBU and an RFU at different locations and which is capable of connecting a plurality of RFUs to one BBU via an optical interface is becoming widespread. In such a base station, for example, CPRI (Common Public Radio Interface) has been stipulated as the standard of an interface for connecting an RFU and a BBU. For example, the BBU and RFU transmit digitized baseband signals to each other via an optical interface complying with CPRI. Note that the RFU may also be referred to as a remote radio head (RRH).

In a CPRI line for connecting a BBU and an RFU, due to an enlargement of the bandwidth of a base station, an implementation of multiband, an increase in multiplex number of MIMO, and the like, a large amount of traffic occurs and a necessary transmission capacity can suddenly increase. A large amount of traffic can be accommodated by laying down a number of optical fibers between the BBU and the RFU but the construction of the optical fibers requires a high cost. Although it can be considered to multiplex a number of CPRI lines by wavelength division multiplexing (WDM), this increases the apparatus cost for an optical transceiver and the like.

In view of the above, a technique of compressing a baseband signal and transmitting the compressed signal between the BBU and the RFU has been considered to accommodate a large amount of traffic by a CPRI line while suppressing an increase in cost. PTL 1 proposes some methods for compressing digitized baseband signal samples to be transmitted between a BBU and an RFU. More specifically, compression by Huffman coding, compression by calculation of a primary or higher-order difference between baseband signal samples and coding of the difference, compression based on at least one of a sampling rate, sample width, bandwidth, and modulation type, and the like are proposed. For example, in compression by Huffman coding, the frequencies of occurrence of sampled values are obtained in advance using a series of sampled values of a baseband signal, and sample compression is performed by assigning a shorter code to a sampled value as its frequency of occurrence is higher.

CITATION LIST

Patent Literature

PTL 1: Japanese Patent Laid-Open No. 2011-526095

SUMMARY OF INVENTION

Technical Problem

Figure 10:
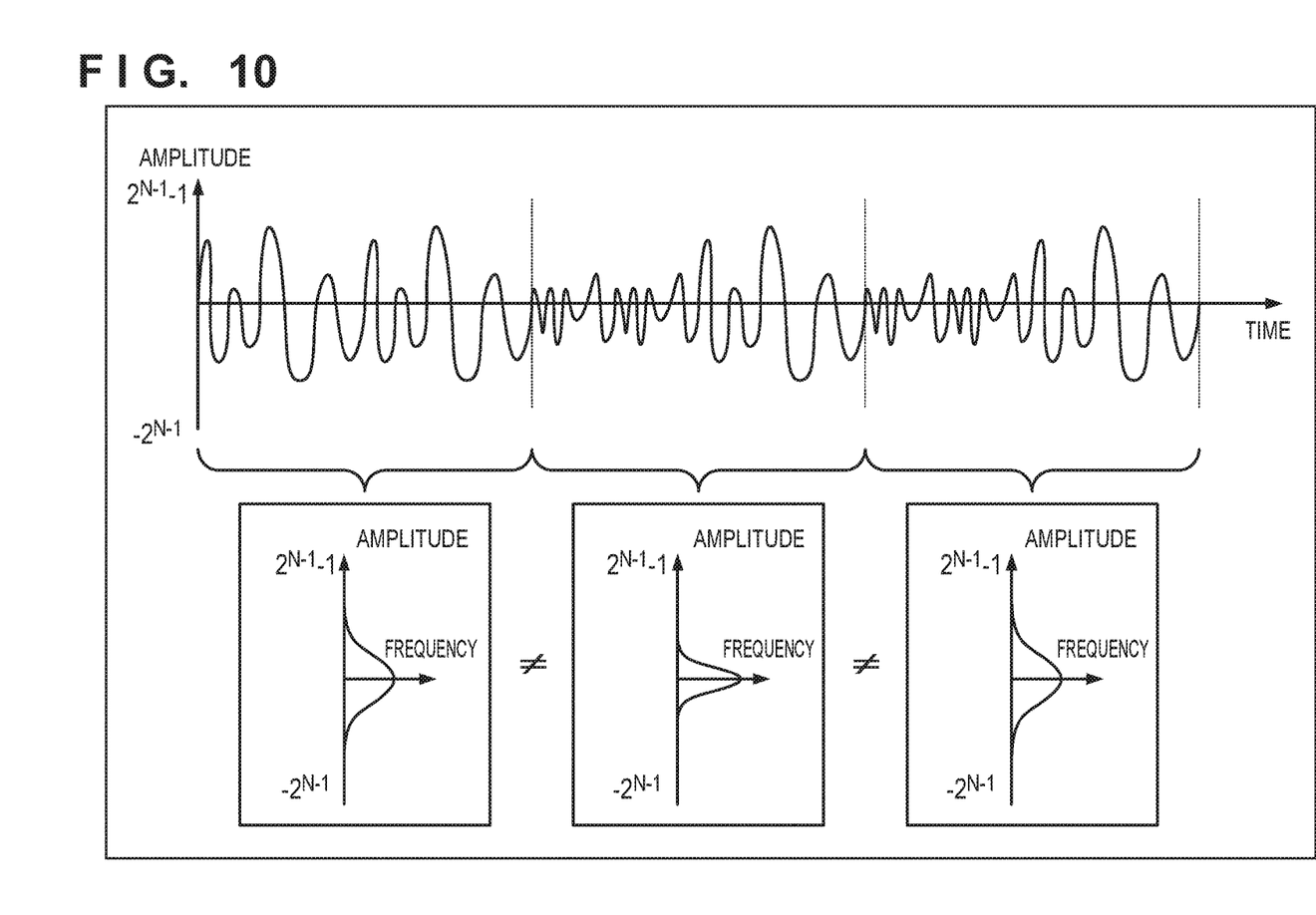
FIG. 10 is a view showing an example of the frequency distribution of sampled values corresponding to a baseband signal.

In the technique described in PTL 1, however, the following problems arise. For example, when performing data compression by Huffman coding as described above, if the frequency distribution of sampled values corresponding to a baseband signal temporally varies, a data compression ratio also temporally varies. As exemplified in FIG. 10, the average power of a baseband signal transmitted between a BBU and an RFU varies on the order of several hundred milliseconds, and accordingly, the frequency distribution of sampled values (amplitudes) corresponding to the baseband signal also varies on the same order. Consequently, the data compression ratio in compression by Huffman coding temporally varies. As a result, it may be impossible to ensure a sufficient data compression ratio when compressing the baseband signal transmitted between the BBU and the RFU, and to achieve a required data compression ratio (for example, 50%).

Alternatively, when performing data compression by calculation of a primary or higher-order difference between baseband signal samples and coding of the difference, it may be impossible, due to a temporal variation in baseband signal, to suppress the number of bits required for coding of the difference between sampled values (amplitudes) to that which achieves a required data compression ratio. In this case, it may be impossible to achieve the required data compression ratio while suppressing degradation in signal quality along with compression.

The present invention has been made in consideration of the above-described problems, and provides a technique of making it possible to compress, at a higher data compression ratio, a baseband signal transmitted between a BBU and an RFU via a communication line in a base station system while suppressing degradation in signal quality along with compression.

Solution to Problem

According to one aspect of the present invention, there is provided a base station system comprising a baseband unit and a radio frequency (RF) unit connected to the baseband unit via a communication line, the RF unit comprising: a generation unit configured to generate, as sampled data, a digital signal corresponding to a baseband signal to be transmitted to the baseband unit; a measurement unit configured to measure frequencies of occurrence of amplitudes indicated by the sampled data generated by the generation unit, and generate a frequency distribution representing a relationship between an amplitude having occurred and a frequency of occurrence; a determination unit configured to determine a plurality of thresholds for compressing the sampled data, which are used for quantization processing of an amplitude, in accordance with the frequency distribution generated by the measurement unit; and a compression unit configured to compress the sampled data by the quantization processing using the plurality of thresholds determined by the determination unit to generate compressed data to be transmitted to the baseband unit.

According to another aspect of the present invention, there is provided a base station system comprising a baseband unit and a radio frequency (RF) unit connected to the baseband unit via a communication line, the baseband unit comprising: a generation unit configured to generate, as sampled data, a digital signal corresponding to a baseband signal to be transmitted to the RF unit; a measurement unit configured to measure frequencies of occurrence of amplitudes indicated by the sampled data generated by the generation unit, and generate a frequency distribution representing a relationship between amplitude having occurred and a frequency of occurrence; a determination unit configured to determine a plurality of thresholds for compressing the sampled data, which are used for quantization processing of amplitude, in accordance with the frequency distribution generated by the measurement unit; and a compression unit configured to compress the sampled data by the quantization processing using the plurality of thresholds determined by the determination unit to generate compressed data to be transmitted to the RF unit.

According to one aspect of the present invention, there is provided a communication apparatus for communicating with an opposing apparatus connected via a communication line in a base station system, comprising: a generation unit configured to generate, as sampled data, a digital signal corresponding to a baseband signal to be transmitted to the opposing apparatus; a measurement unit configured to measure frequencies of occurrence of amplitudes indicated by the sampled data generated by the generation unit, and generate a frequency distribution representing a relationship between amplitude having occurred and a frequency of occurrence; a determination unit configured to determine a plurality of thresholds for compressing the sampled data, which are used for quantization processing of amplitude, in accordance with the frequency distribution generated by the measurement unit; and a compression unit configured to compress the sampled data by the quantization processing using the plurality of thresholds determined by the determination unit to generate compressed data to be transmitted to the opposing apparatus.

Advantageous Effects of Invention

According to the present invention, it is possible to compress, at a higher data compression ratio, a baseband signal transmitted between a BBU and an RFU via a communication line in a base station system while suppressing degradation in signal quality along with compression.

Other features and advantages of the present invention will be apparent from the following description taken in conjunction with the accompanying drawings. Note that the same reference numerals denote the same or like components throughout the accompanying drawings.

BRIEF DESCRIPTION OF DRAWINGS

The accompanying drawings, which are incorporated in and constitute a part of the specification, illustrate exemplary embodiments of the invention and, together with the description, serve to explain the principles of the present invention.

DESCRIPTION OF EMBODIMENTS

Exemplary embodiments of the present invention will be described below with reference to the accompanying drawings. Note that components unnecessary for the description of the embodiments are omitted from the accompanying drawings.

[First Embodiment]

The first embodiment of the present invention will be described with reference to FIGS. 1 to 8.

<Configuration of Base Station System>

Figure 1:
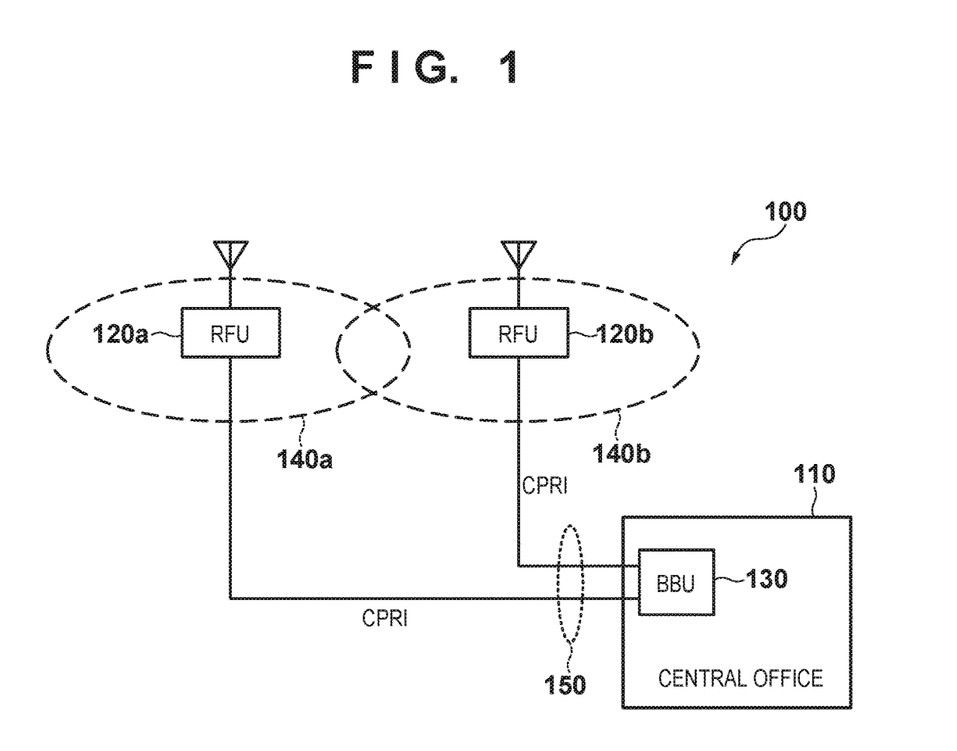
FIG. 1 is a block diagram showing an example of the configuration of a base station system.

FIG. 1 is a block diagram showing an example of the configuration of a base station system 100 according to this embodiment. In this embodiment, the base station system 100 includes a central office (CO) 110 connected to a core network, and a plurality of RF units (RFUs) 120a and 120b each for executing radio frequency (RF) processing and the like in radio communication. A baseband unit (BBU) 130 for executing baseband processing and the like in radio communication is provided in the central office 110. The RFUs 120a and 120b form service areas 140a and 140b for radio communication, respectively. Each of the RFUs 120a and 120b is connected to an antenna for cellular communication, and performs, via the antenna, radio communication with a user terminal such as a mobile phone existing in the service area formed by itself.

In this embodiment, as shown in FIG. 1, the BBU is centralized in the central office 110, and shared by the plurality of RFUs, instead of individually providing the BBU for each of the plurality of RFUs. An arbitrary number of RFUs are connectable to the BBU 130 via a communication line 150. In the base station system 100, the two RFUs 120a and 120b are connected to the BBU 130, as an example. Note that the RFUs 120a and 120b have the same arrangement and, in the following explanation, an RFU 120 indicates each of the RFUs 120a and 120b.

The communication line 150 is a front-haul line connecting the BBU 130 and the RFU 120 and, in this embodiment, is formed as an optical line (CPRI line) complying with CPRI. The BBU 130 and the RFU 120 transmit digitized baseband signals to each other via the communication line 150.

Figure 2:
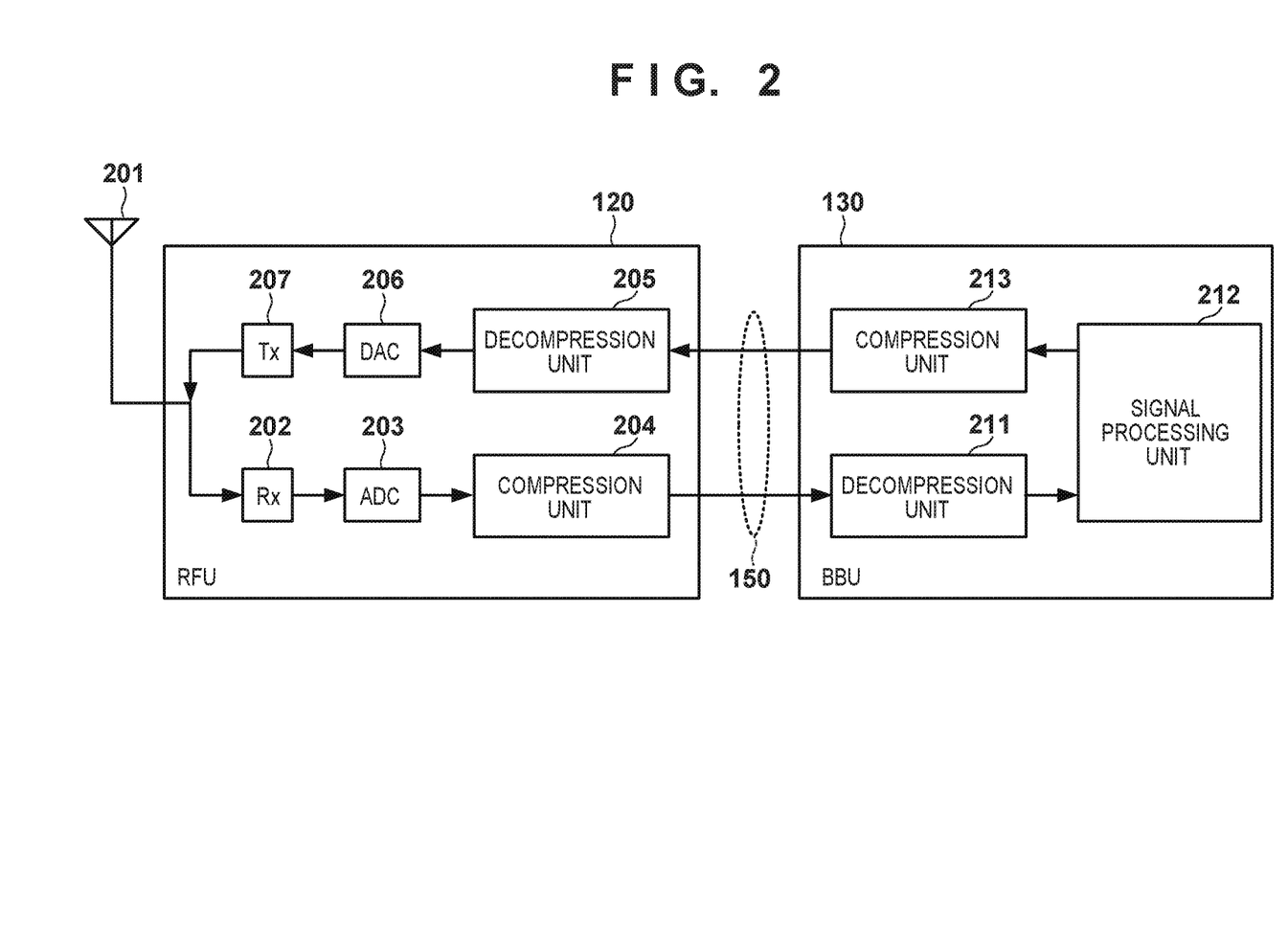
FIG. 2 is a block diagram showing examples of the arrangements of an RFU and a BBU in the base station system.

FIG. 2 is a block diagram showing examples of the arrangements of the RFU 120 and the BBU 130 in the base station system 100 according to this embodiment. The RFU 120 is connected to an antenna 201, and includes a reception unit (Rx) 202, an analog-to-digital converter (ADC) 203, a compression unit 204, a decompression unit 205, a digital-to-analog converter (DAC) 206, and a transmission unit (Tx) 207. The BBU 130 includes a decompression unit 211, a signal processing unit 212, and a compression unit 213. The compression unit 204 on the side of the RFU 120 is connected to the decompression unit 211 on the side of the BBU 130 via the communication line 150. The compression unit 213 on the side of the BBU 130 is connected to the decompression unit 205 on the side of the RFU 120 via the communication line 150. The arrangement of each of the compression units 204 and 213 and that of each of the decompression units 205 and 211 will be described later with reference to FIGS. 3 and 4. Note that in the base station system 100, the compression units 204 and 213, decompression units 211 and 213, and signal processing unit 212 individually execute processing (to be described later) for data of each of an in-phase (I) channel component and quadrature (Q) channel component of the baseband signal (sampled data).

(Signal Transmission in Uplink Direction)

Signal transmission in an uplink direction from the RFU 120 to the BBU 130 in the base station system 100 will be explained. In the RFU 120, the antenna 201 receives radio signals transmitted from one or more user terminals. The radio signal received by the antenna 201 is, after being converted into an analog signal (analog electric signal), down-converted from an RF to a baseband frequency by the Rx 202. This generates a baseband signal containing an I channel component and a Q channel component. The baseband signal output from the Rx 202 is input to the ADC 203.

The ADC 203 converts each of the I channel component and Q channel component of the input baseband signal from an analog signal to a digital signal by sampling processing and quantization processing, and outputs the converted signal as sampled data. The sampled data includes I channel data and Q channel data. Note that the ADC 203 performs sampling processing at a sampling frequency Fs, and performs quantization processing with a sample width (the number of quantization bits) of N bits. The sampled data output from the ADC 203 is input to the compression unit 204. In this manner, the Rx 202 and the ADC 203 generate, as sampled data, a digital signal corresponding to the baseband signal to be transmitted to the BBU 130.

The compression unit 204 executes, for the input sampled data, compression processing of converting (compressing) sampled data of N bits per sample into sampled data (compressed data) of M bits (M<N) per sample. That is, the compression unit 204 executes compression processing of a compression ratio (data compression ratio) M/N. The M-bit compressed data output from the compression unit 204 is transmitted to the BBU 130 via the communication line 150.

In the BBU 130, the compressed data received from the RFU 120 via the communication line 150 is first input to the decompression unit 211. The decompression unit 211 executes, for the input compressed data, decompression processing of converting (decompressing) sampled data of M bits per sample into sampled data of N bits per sample. The N-bit sampled data output from the decompression unit 211 is output to the signal processing unit 212. The signal processing unit 212 extracts user data by performing predetermined baseband signal processing (demodulation, error correction, and the like) for the input sampled data (baseband signal).

(Signal Transmission in Downlink Direction)

Signal transmission in a downlink direction from the BBU 130 to the RFU 120 in the base station system 100 will now be explained. In the BBU 130, the signal processing unit 212 sets one or more user terminals as destinations, generates, as sampled data, a digital signal corresponding to a baseband signal to be transmitted to the RFU 120, and outputs the sampled data to the compression unit 213. Similarly to the compression unit 204, the compression unit 213 executes, for the input sampled data, compression processing of converting (compressing) sampled data of N bits per sample into sampled data (compressed data) of M bits (M<N) per sample. The M-bit compressed data output from the compression unit 213 is transmitted to the RFU 120 via the communication line 150.

In the RFU 120, the compressed data received from the BBU 130 via the communication line 150 is first input to the decompression unit 205. Similarly to the decompression unit 211, the decompression unit 205 executes, for the input compressed data, decompression processing of converting (decompressing) sampled data of M bits per sample into sampled data of N bits per sample. The N-bit sampled data output from the decompression unit 211 is output to the DAC 206. The DAC 206 respectively converts the I channel component data and Q channel component data of the input sampled data into analog signals, and outputs the converted signals to the Tx 207. The Tx 207 up-converts the input analog signals of the I channel and Q channel from the baseband frequency to the RF, and outputs the up-converted analog signals to the antenna 201. The analog signals of the RF are transmitted from the antenna 201 as radio signals.

Note that in this embodiment, in signal transmission in the uplink direction, the RFU 120 is an example of a communication apparatus for communicating with an opposing apparatus connected via the communication line 150, and the BBU 130 is an example of the opposing apparatus. On the other hand, in signal transmission in the downlink direction, the BBU 130 is an example of a communication apparatus for communicating with an opposing apparatus connected via the communication line 150, and the RFU 120 is an example of the opposing apparatus.

In this embodiment, in the compression processing by the compression unit 204 or 213, lossy compression is performed for the digitized baseband signal (sampled data) to be transmitted via the communication line 150 so as to increase the compression ratio as much as possible. That is, if M-bit (M<N) sampled data compressed from N-bit sampled data is decompressed to N-bit sampled data by the decompression unit 205 or 211, data different from the N-bit sampled data before compression can be obtained. This can degrade the quality of the baseband signal transmitted between the RFU 120 and the BBU 130.

This embodiment has as its feature to perform compression processing by non-uniform (non-linear) quantization processing in accordance with the frequency distribution of the sampled values (amplitudes) of the baseband signal, in order to achieve a high compression ratio even under an environment in which the baseband signal temporally varies, while suppressing degradation in signal quality along with compression.

<Compression Unit>

Figure 3:
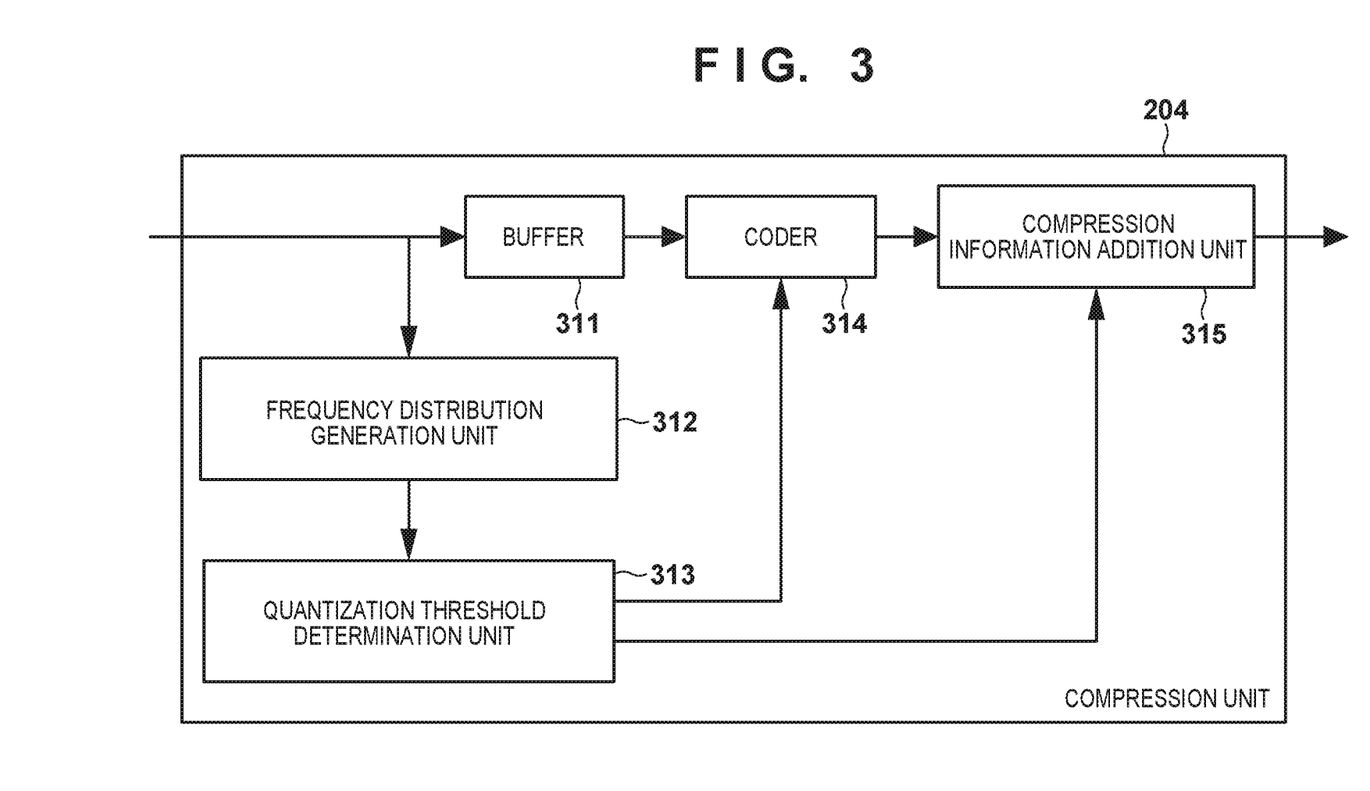
FIG. 3 is a block diagram showing an example of the arrangement of the compression unit of each of the BBU and RFU.

FIG. 3 is a block diagram showing an example of the arrangement of the compression unit 204 of the RFU 120 according to this embodiment. Note that the compression unit 213 of the BBU 130 has the same arrangement. The compression unit 204 includes a buffer 311, a frequency distribution generation unit 312, a quantization threshold determination unit 313, a coder 314, and a compression information addition unit 315. The sampled data input to the compression unit 204 is saved in the buffer 311 and input to the frequency distribution generation unit 312.

(Generation of Frequency Distribution)

The frequency distribution generation unit 312 measures, using the N-bit sampled data, the frequencies of occurrence of sampled values (amplitudes) indicated by the sampled data, and generates a frequency distribution representing the relationship between the sampled value having occurred and its frequency of occurrence. The frequency distribution generation unit 312 generates a frequency distribution for each of I channel data and Q channel data included in the sampled data. Note that the frequency distribution generation unit 312 generates a frequency distribution using the sampled data (a series of sampled data) corresponding to a predetermined number of samples. Furthermore, the frequency distribution generation unit 312 can update the frequency distribution every time the sampled data of one sample is input.

Figure 5:
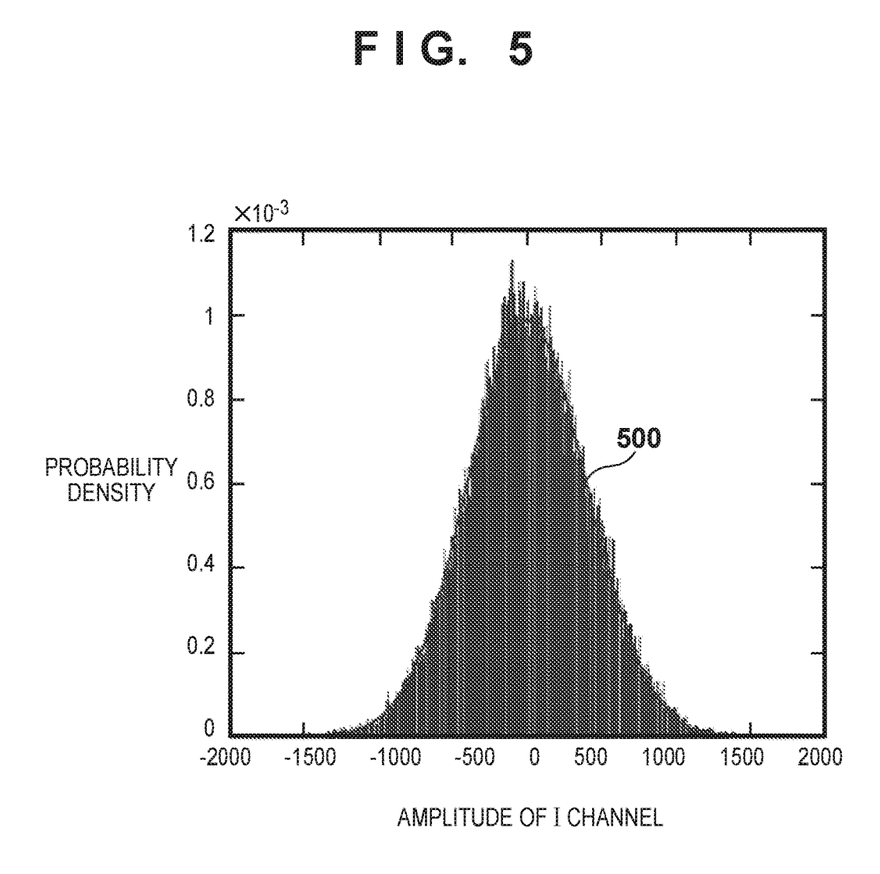
FIG. 5 is a graph showing an example of a frequency distribution generated by a frequency distribution generation unit.

FIG. 5 is a graph showing an example of the frequency distribution generated by the frequency distribution generation unit 312. FIG. 5 shows a frequency distribution generated using the I channel data of a 16-bit (N=16) digital signal obtained by converting an actual uplink LTE signal received for 5 sec. Note that the abscissa represents the sampled value (amplitude) of an I channel, and the ordinate represents a probability density corresponding to the frequency of occurrence. The frequency distribution generated by the frequency distribution generation unit 312 depends on the statistical features of the baseband signal to be transmitted to the BBU 130. The frequency distribution shown in FIG. 5 indicates a normal distribution 500, and it is understood that the obtained frequency distribution can be generally approximated by the normal distribution 500.

If it is known in advance that the baseband signal (sampled data) to be processed by the frequency distribution generation unit 312 can be approximated by the normal distribution, as shown in FIG. 5, it is possible to readily generate a frequency distribution by calculating a mean $\mu$ and a standard deviation $\sigma$ of the frequencies of occurrence of the sampled values. In this case, the frequency distribution generation unit 312 measures the frequencies of occurrence of the sampled values using the input series of sampled data, and calculates the mean $\mu$ and standard deviation $\sigma$ (or variance $\sigma^2$) of the frequencies of occurrence based on the measurement result. Furthermore, the frequency distribution generation unit 312 generates, as a frequency distribution, a normal distribution $N(\mu, \sigma^2)$ determined by the calculated mean $\mu$ and standard deviation $\sigma$.

(Determination of Quantization Threshold)

The frequency distribution generated by the frequency distribution generation unit 312 is input to the quantization threshold determination unit 313. In accordance with the input frequency distribution, the quantization threshold determination unit 313 determines a plurality of thresholds for compressing (quantizing) the sampled data by the coder 314, which are used for sampled value quantization processing. More specifically, for example, to compress (quantize) the N-bit sampled data to the M-bit sampled data, the quantization threshold determination unit 313 generates $2^M$ thresholds (to also be referred to as "quantization thresholds" hereinafter) to be compared with the sampled values at the time of compression.

Figure 6:
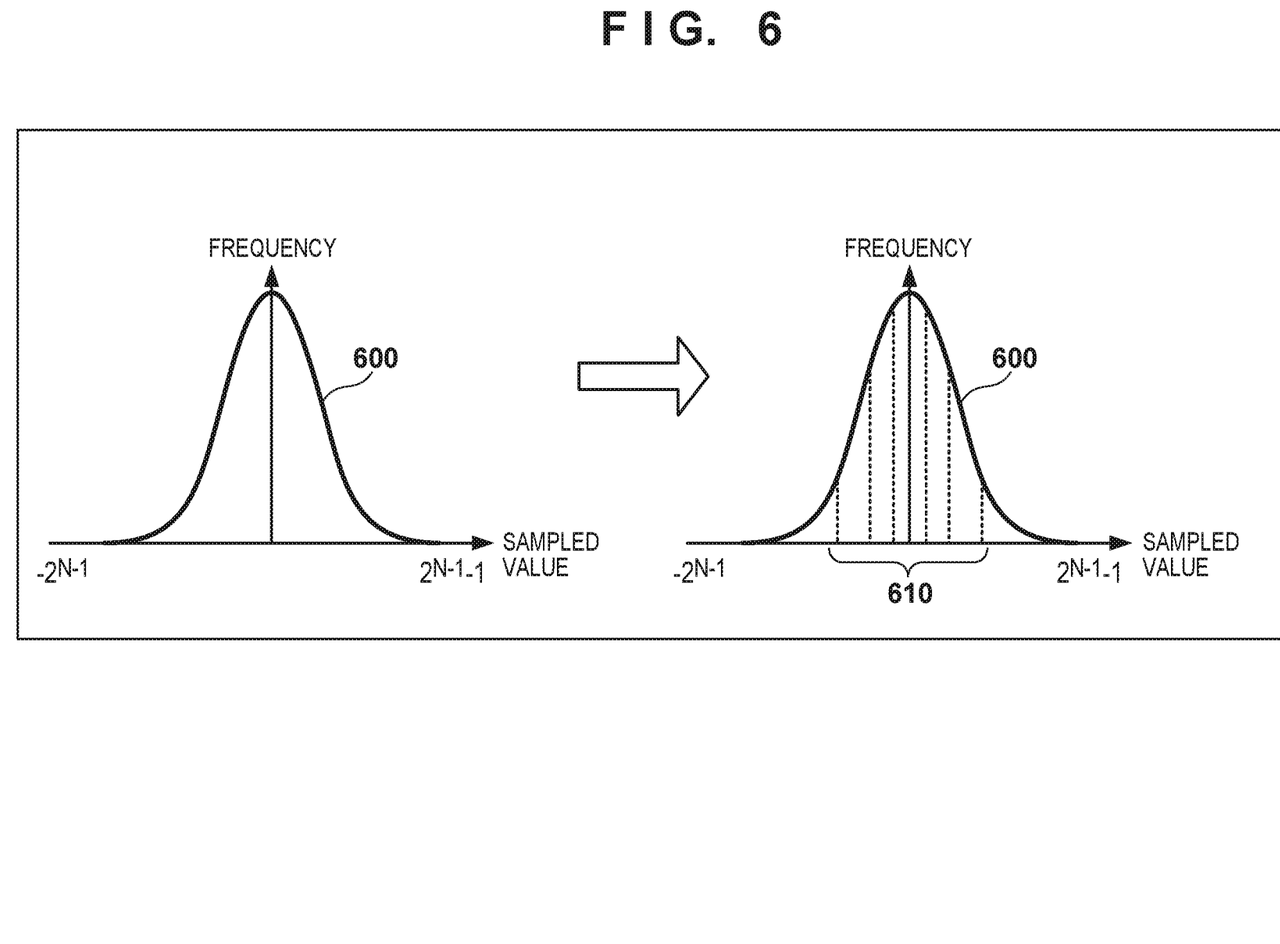
FIG. 6 is a view schematically showing a quantization threshold determination process based on the frequency distribution.
Figure 7:
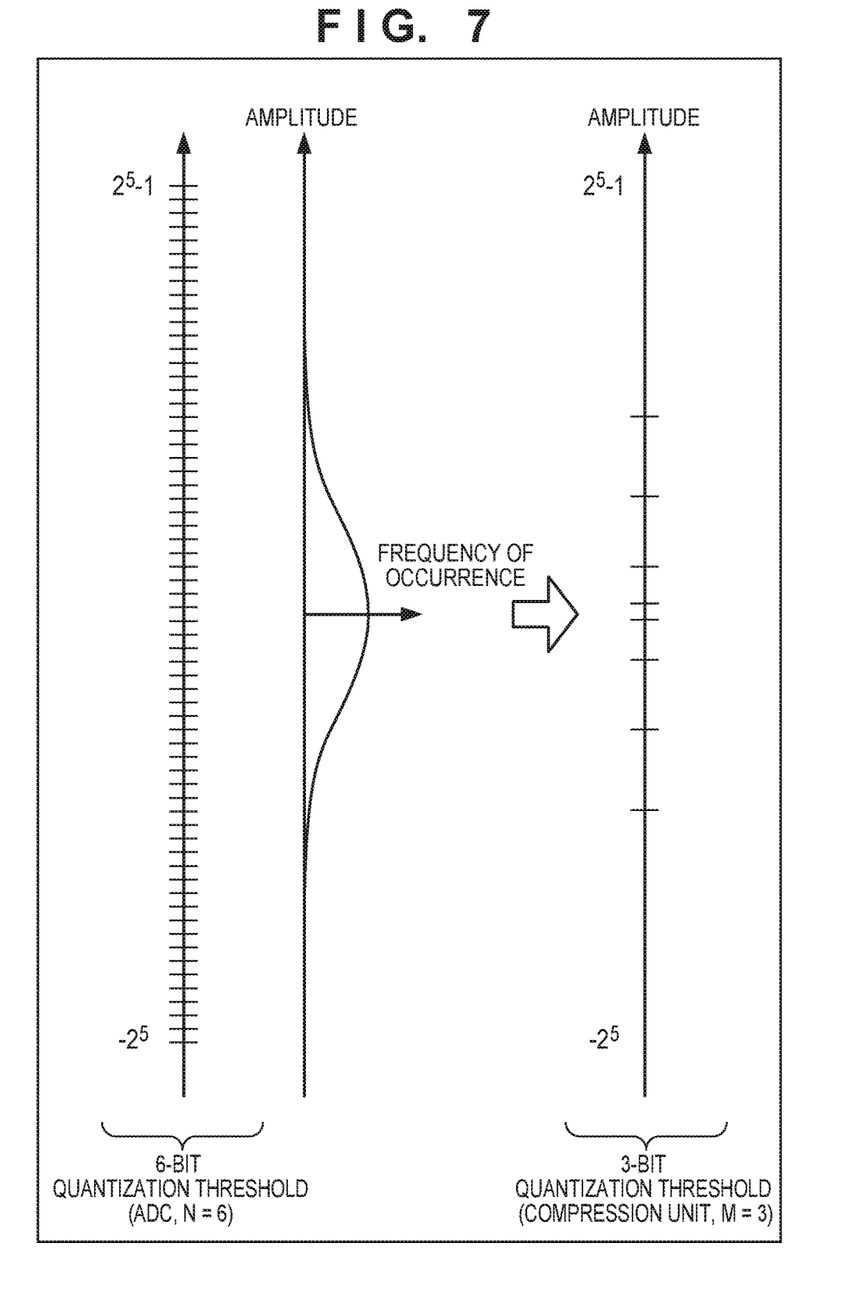
FIG. 7 is a view schematically showing the quantization threshold determination process based on the frequency distribution.

FIGS. 6 and 7 are views schematically showing a quantization threshold determination process based on the frequency distribution by the quantization threshold determination unit 313. FIG. 6 shows a case in which the frequency distribution generation unit 312 generates a frequency distribution 600 by approximation using the normal distribution. Note that in FIG. 6, the abscissa represents each sampled value (amplitude) of the N-bit sampled data by a decimal number and the ordinate represents the frequency of occurrence of each sampled value. As shown in FIG. 6, based on the frequency distribution 600, the quantization threshold determination unit 313 determines thresholds 610 the number ($2^M$) of which corresponds to the compression ratio. The thresholds 610 can be determined as shown in FIG. 7.

FIG. 7 shows quantization thresholds for obtaining N-bit (6-bit) sampled data, which are used for quantization by the ADC 203, and quantization thresholds for obtaining M-bit (3-bit) sampled data, which are used for compression (quantization) by the compression unit 204. Note that the ADC 203 performs N-bit quantization using the plurality of thresholds with equal intervals, thereby generating N-bit sampled data. On the other hand, the compression unit 204 converts (compresses) N-bit sampled data into M-bit sampled data using the plurality of thresholds with unequal intervals, which are determined in accordance with the frequency distribution generated by the frequency distribution generation unit 312.

The quantization thresholds used in compression by the compression unit 204 can be determined in accordance with the frequency distribution, as follows. More specifically, as shown in FIG. 7, the quantization threshold determination unit 313 may determine the plurality of thresholds so that, for each of the plurality of sections obtained by dividing, using the plurality of thresholds, a range within which the sampled values (amplitudes) can fall, the width (quantization step width or quantization step size) of the section becomes narrower as the frequency of occurrence of the amplitude included in the section is higher. To the contrary, the quantization threshold determination unit 313 may determine the plurality of thresholds so that, for each of the plurality of sections obtained by dividing, using the plurality of thresholds, the range within which the amplitudes can fall, the width of the section becomes wider as the frequency of occurrence of the amplitude included in the section is lower.

Determination of a plurality of quantization thresholds by the quantization threshold determination unit 313 can be implemented using the frequency distribution by, for example, the following method. That is, for each of the plurality of sections obtained by dividing, using the plurality of thresholds, the range within which the amplitudes can fall, the integrated value of the frequencies of occurrence of amplitudes included in the section is calculated. Furthermore, a plurality of quantization thresholds may be determined so that the calculated integrated values for the plurality of respective sections become equal to each other (as much as possible). More specifically, the plurality of quantization thresholds may be determined so that a value obtained by integrating the frequencies of occurrence of amplitudes in a section (quantization step) between a j-th quantization threshold and a (j+1)-th quantization threshold becomes equal for all of j=0, . . . , 2M−1 as much as possible.

Figure 8:
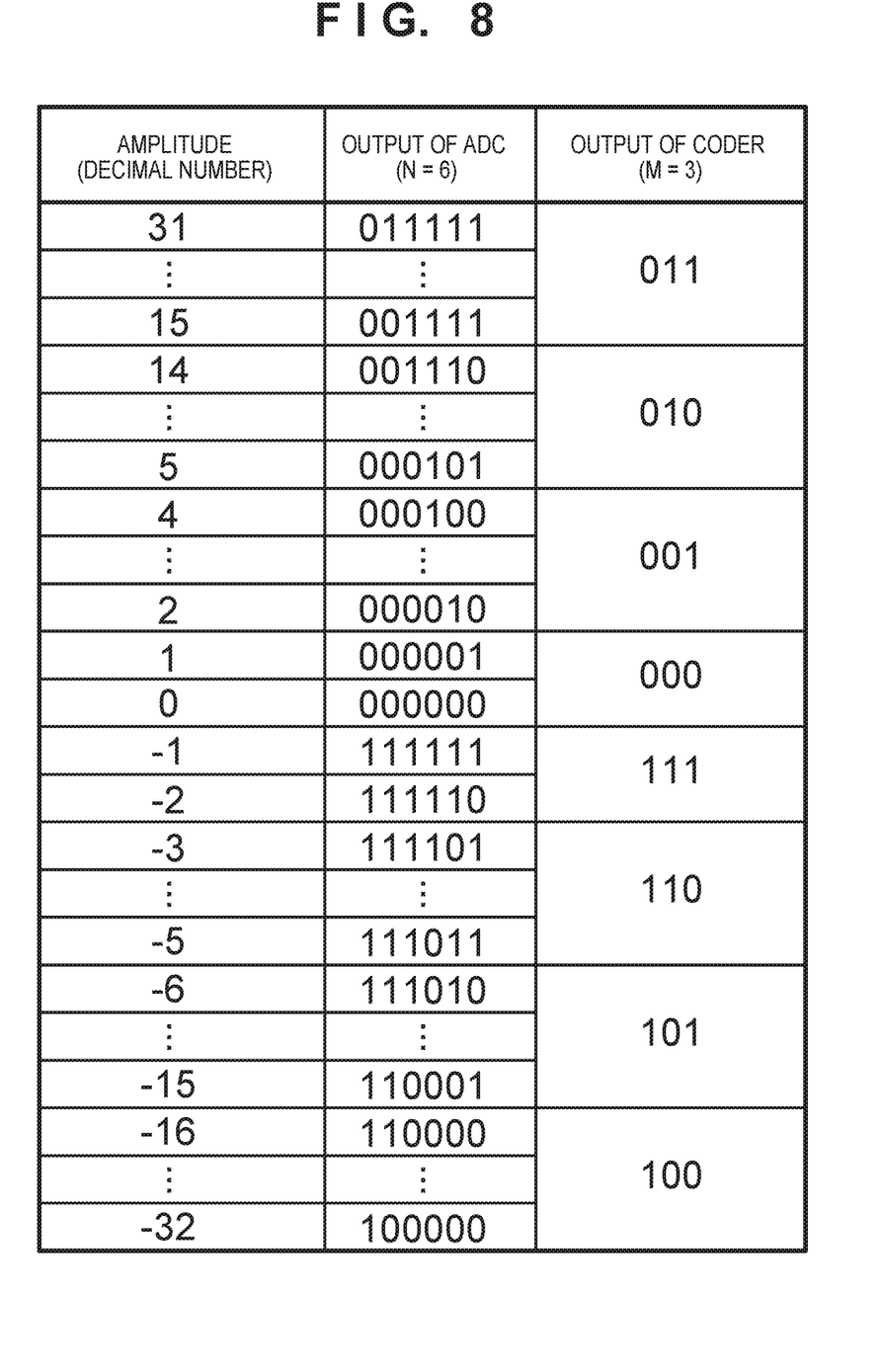
FIG. 8 is a table showing an example of a conversion table used for compression processing.

In addition, the quantization threshold determination unit 313 determines, based on the plurality of determined quantization thresholds, the correspondence between an output of the ADC 203 and that of the coder 314. FIG. 8 is a table showing an example of the correspondence between an output of the ADC 203 and that of the coder 314 when N=6 and M=3. The quantization threshold determination unit 313 assigns one output of the coder 314 to each section of sampled values obtained by dividing, using the quantization thresholds determined as described above, the range within which the sampled values (amplitudes) can fall. For example, "011" is assigned, as an output of the coder 314, to a section of sampled values (amplitudes) of 15 to 31 (outputs "001111" to "011111" of the ADC 203). The quantization threshold determination unit 313 outputs, to the coder 314 and the compression information addition unit 315, data indicating a conversion table for associating N-bit sampled data with M-bit sampled data, as shown in FIG. 8.

(Compression Processing)

The series of sampled data input to the compression unit 204 is saved (buffered) in the buffer 311 until the quantization threshold determination unit 313 determines quantization thresholds, and generates the conversion table as shown in FIG. 8. After the conversion table generated by the quantization threshold determination unit 313 is input, the coder 314 sequentially reads out N-bit sampled data from the buffer 311, and performs compression processing for the readout sampled data. In this way, the coder 314 applies, to the series of sampled data used by the frequency distribution generation unit 312 to generate the frequency distribution, compression processing using the quantization thresholds determined in accordance with the frequency distribution.

The coder 314 generates compressed data to be transmitted to the BBU 130 by compressing the sampled data by quantization processing using the plurality of quantization thresholds determined by the quantization threshold determination unit 313. More specifically, the coder 314 converts the N-bit sampled data (the output of the ADC 203) read out from the buffer 311 into the associated M-bit sampled data by referring to the conversion table output from the quantization threshold determination unit 313. With this processing, the coder 314 compresses the N-bit sampled data to the M-bit sampled data, and outputs the compressed data.

(Transmission Processing)

The sampled data (compressed data) output from the coder 314 is input to the compression information addition unit 315. The compression information addition unit 315 adds, to the input compressed data, control information (compression information) to be used in decompression processing by the decompression unit 211 of the BBU 130 on the reception side, and transmits the resultant data to the BBU 130 via the communication line 150. The control information includes information indicating the plurality of quantization thresholds determined by the quantization threshold determination unit 313, and may include, for example, the conversion table as shown in FIG. 8. Alternatively, the compression unit 204 and the decompression unit 211 may hold in advance a plurality of conversion tables corresponding to a plurality of different frequency distributions, and the coder 314 may perform compression processing using the conversion table corresponding to the frequency distribution generated by the frequency distribution generation unit 312. In this case, the control information transmitted by the compression information addition unit 315 may include information indicating the conversion table used. In addition, the compression information addition unit 315 may transmit, as the control information transmitted to the BBU 130, the mean $\mu$ and standard deviation $\sigma$ calculated by the frequency distribution generation unit 312 to the BBU 130.

<Decompression Unit>

Figure 4:
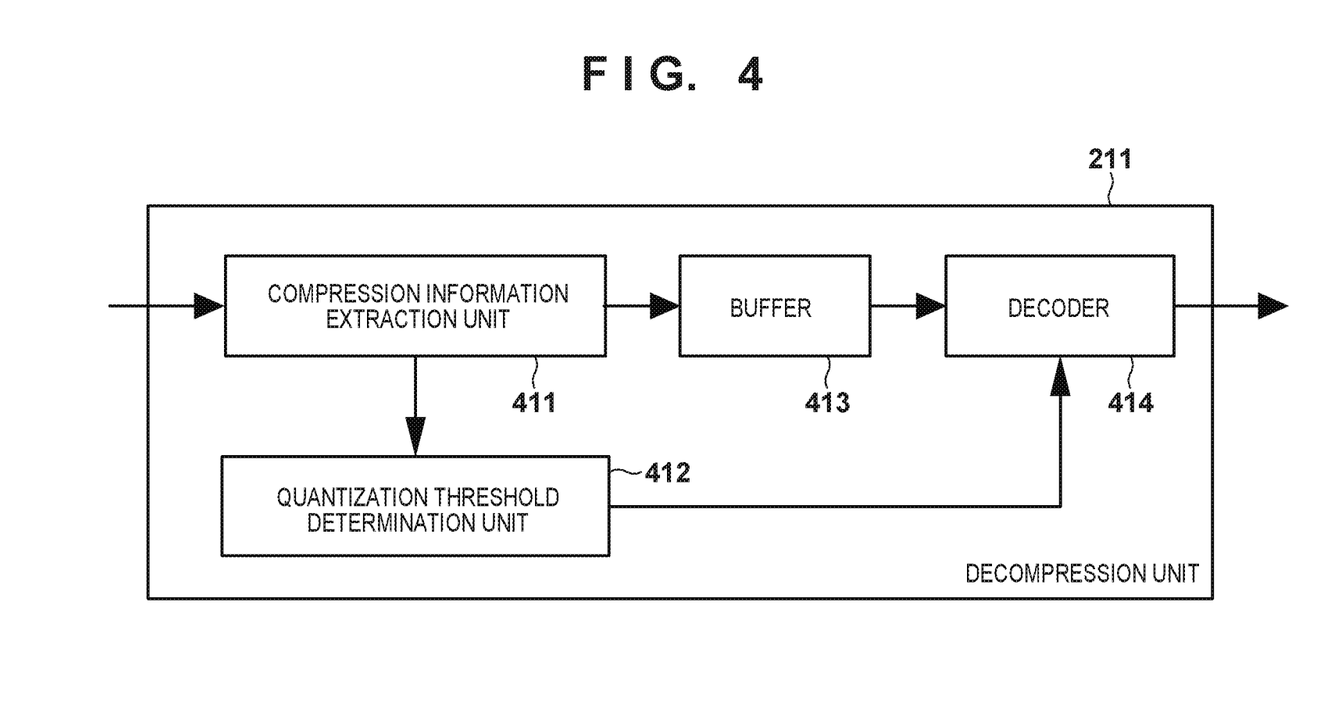
FIG. 4 is a block diagram showing an example of the arrangement of the decompression unit of each of the BBU and RFU.

FIG. 4 is a block diagram showing an example of the arrangement of the decompression unit 211 of the BBU 130 according to this embodiment. Note that the decompression unit 205 of the RFU 120 has the same arrangement. The decompression unit 211 includes a compression information extraction unit 411, a quantization threshold determination unit 412, a buffer, and a decoder 414. The data which has been received from the RFU 120 via the communication line 150 and input to the decompression unit 211 is input to the compression information extraction unit 411.

The compression information extraction unit 411 extracts, from the input data, control information (compression information) added to the compressed data by the compression information addition unit 315, and outputs the control information to the quantization threshold determination unit 412. Furthermore, the compression information extraction unit 411 saves, in the buffer 413, the compressed data included in the input data. Based on the control information input from the compression information extraction unit 411, the quantization threshold determination unit 412 determines a plurality of quantization thresholds to be used in decompression processing by the decoder 414. For example, the quantization threshold determination unit 412 may extract the conversion table as shown in FIG. 8 from the control information, and output the conversion table to the decoder 414.

The decoder 414 sequentially reads out the M-bit compressed data (sampled data) from the buffer 413, and performs decompression processing of decompressing the compressed data using the conversion table input from the quantization threshold determination unit 412. More specifically, the decoder 414 performs decompression processing by converting the M-bit compressed data into N-bit sampled data. For example, the decoder 414 outputs, as decompressed sampled data, one of a plurality of N-bit outputs of the ADC, which corresponds to the M-bit compressed data (the output of the coder).

As described above, according to this embodiment, since compression processing is performed so that a quantization step corresponding to an amplitude becomes narrower as the frequency of occurrence of the amplitude is higher, it is possible to reduce an error between the amplitudes before and after compression. On the other hand, sampled data for which an error between amplitudes before and after compression becomes large is limited to sampled data for which the frequency of occurrence of an amplitude is low. Consequently, when applying compression processing to N-bit sampled data, it is possible to more accurately represent the sampled data by M-bit (M<N) sampled data. According to this embodiment, it is therefore possible to compress the baseband signal at a high compression ratio while suppressing degradation (that is, quantization noise) in signal quality along with compression processing, by adaptively controlling quantization thresholds to be used for data compression in accordance with the frequency distribution.

Note that the frequency distribution generated by the frequency distribution generation unit 312 can be updated by one sample at minimum. Therefore, a processing delay amount caused by compression processing and decompression processing can be suppressed to a small amount (for example, 100 μsec or less).

[Second Embodiment]

The second embodiment of the present invention will be described next. In this embodiment, the frequency distribution of sampled data is approximated by a normal distribution, and a plurality of quantization thresholds for compressing the sampled data is determined in accordance with the normal distribution. Especially, this embodiment has as its feature to calculate the cumulative distribution function of the frequency distribution (normal distribution), and determine a plurality of quantization thresholds based on the calculated cumulative distribution function. Note that the configuration (FIGS. 1 to 4) of a base station system 100 (a BBU 130 and RFUs 120) according to this embodiment is the same as in the first embodiment. The operation of the base station system 100 different from the first embodiment will be described below exemplifying baseband signal transmission in an uplink direction from the RFU 120 to the BBU 130.

<Compression Unit>

In a compression unit 204 of the RFU 120, a frequency distribution generation unit 312 measures the frequencies of occurrence of sampled values (amplitudes) indicated by input sampled data, and calculates a mean μ and standard deviation σ of them. The frequency distribution generation unit 312 generates, as a frequency distribution, a normal distribution N(μ, σ2) determined by the calculated mean μ and standard deviation σ. Note that the frequency distribution generation unit 312 generates a frequency distribution for each of I channel data and Q channel data, similarly to the first embodiment. A probability density function f(x) of the normal distribution N(μ, σ2) is given by:

$$f(x) = \frac{1}{\sqrt{2\pi} \cdot \sigma} \exp\left(-\frac{(x-\mu)^2}{2\sigma^2}\right) \quad (1)$$

The frequency distribution generation unit 312 outputs the calculated mean μ and standard deviation σ to a quantization threshold determination unit 313 as information indicating the frequency distribution of the amplitudes.

The quantization threshold determination unit 313 generates a cumulative distribution function g(x) corresponding to the probability density function f(x) indicated by equation (1), as given by:

$$g(x) = \frac{1}{2}\left\{1 + \mathrm{erf}\left(\frac{x-\mu}{\sqrt{2} \cdot \sigma}\right)\right\} \quad (2)$$

where erf( ) represents an error function. The quantization threshold determination unit 313 determines a plurality of (2M) quantization thresholds based on the cumulative distribution function g(x) indicated by equation (2). More specifically, the quantization threshold determination unit 313 determines, as a plurality of quantization thresholds, a plurality of amplitudes corresponding to a plurality of thresholds for equally dividing a value range (that is, [0, 1]) within which the cumulative distribution function g(x) can fall.

As described above, obtaining a plurality of values of x for equally dividing the value range within which the cumulative distribution function g(x) can fall is equivalent to obtaining a plurality of ranges (sections) of x within which the integrated values of the probability density function f(x) (corresponding to the frequencies of occurrence of the amplitudes) are equal to each other. Therefore, by thus obtaining the plurality of values of x, it is possible to determine a plurality of quantization thresholds in accordance with the frequency distribution as described above. That is, it is possible to determine a plurality of thresholds so that, for each of the plurality of sections obtained by dividing, using the plurality of thresholds, a range within which amplitudes can fall, the width of the section becomes narrower as the frequency of occurrence of the amplitude included in the section is higher. Furthermore, it is possible to determine the plurality of thresholds so that, for each section, the width of the section becomes wider as the frequency of occurrence of the amplitude included in the section is lower.

A process of determining a plurality of quantization thresholds by the quantization threshold determination unit 313 will now be described in more detail with reference to FIG. 9. As denoted by reference numeral 900 in FIG. 9, the frequency distribution generation unit 312 approximates an actual frequency distribution 901 by a normal distribution 902 (N(μ, σ2)) by calculating the mean μ and standard deviation σ of the frequencies of occurrence of the sampled values (amplitudes).

Figure 9:
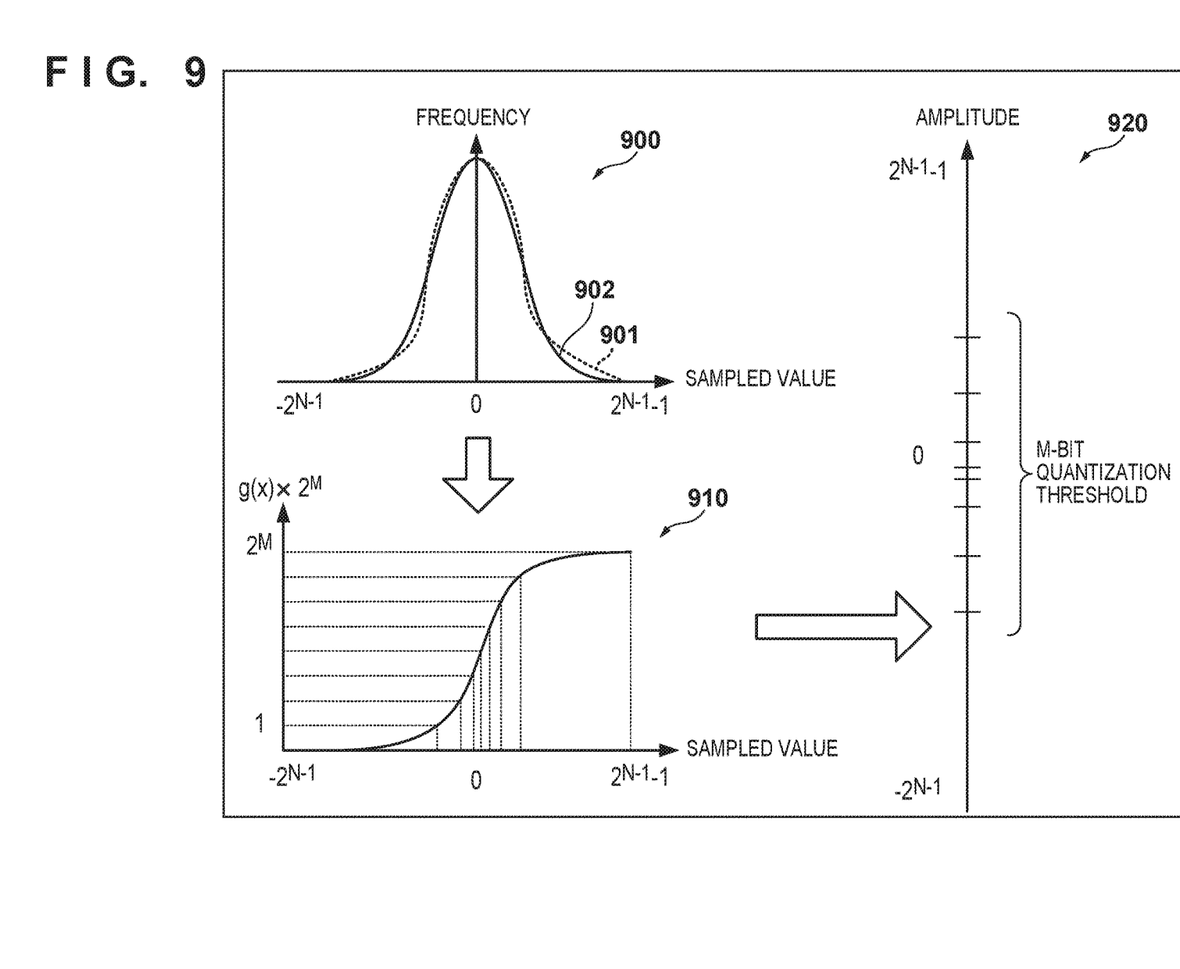
FIG. 9 is a view schematically showing a quantization threshold determination process based on a cumulative distribution function.

Next, as denoted by reference numeral 910 in FIG. 9, the quantization threshold determination unit 313 multiplies the cumulative distribution function g(x) by the number 2M of quantization thresholds to be determined, thereby scaling g(x) by 2M. Consequently, a value range within which the scaled cumulative distribution function g(x) can fall is obtained as [0, 2M]. As a result, it is possible to obtain a plurality of amplitudes corresponding to a plurality of thresholds for equally dividing the value range within which the cumulative distribution function can fall, by obtaining the amplitudes x with which g(x)×2M yields natural numbers (1, 2, . . . , and 2M).

Note that the amplitudes x are discrete values each represented by N bits, and thus it may be impossible to strictly obtain the amplitudes x with which g(x)×2M yields natural numbers (1, 2, . . . , and 2M). Therefore, the quantization threshold determination unit 313 may specify 2M amplitudes x with which g(x)×2M yields values closest to 2M natural numbers (1, 2, . . . , and 2M), respectively, and determine them as 2M quantization thresholds. More specifically, a value closest to g(x)×2M=j (j=1, 2, . . . , 2M) among the possible amplitudes x indicated by N-bit sampled data is determined as the j-th quantization threshold (920 in FIG. 9).

With this process, it is possible to determine a plurality of quantization thresholds so that the integrated value, in a section between the j-th quantization threshold and a (j+1)-th quantization threshold, of the normal distribution N(μ, σ2) corresponding to the frequencies of occurrence of the amplitudes becomes equal for each of j=1, 2, . . . , 2M−1 (as much as possible). Note that the quantization threshold determination unit 313 generates data indicating a conversion table as shown in FIG. 8 based on the plurality of determined quantization thresholds, and outputs the resultant data to a coder 314 and a compression information addition unit 315, similarly to the first embodiment.

By executing the same compression processing as in the first embodiment, the coder 314 compresses N-bit sampled data to M-bit sampled data and outputs it. In addition, by executing the same processing as in the first embodiment, the compression information addition unit 315 transmits, to the BBU 130 via a communication line 150, compressed data added with control information (compression information) to be used in decompression processing by a decompression unit 211 of the BBU 130. Note that the compression information addition unit 315 may transmit, as the control information transmitted to the BBU 130, the mean μ and standard deviation σ calculated by the frequency distribution generation unit 312 to the BBU 130.

<Decompression Unit>

By executing the same decompression processing as in the first embodiment, the decompression unit 211 of the BBU 130 can decompress M-bit compressed data to N-bit sampled data. Note that if the mean μ and standard deviation σ of the frequencies of occurrence of the amplitudes are received from the RFU 120 as control information, a quantization threshold determination unit 412 determines, based on μ and σ, a plurality of quantization thresholds to be used in decompression processing by a decoder 414. In this case, the quantization threshold determination unit 412 determines a plurality of (2M) quantization thresholds based on the cumulative distribution function g(x) indicated by equation (2), and generates data indicating the conversion table shown in FIG. 8, similarly to the quantization threshold determination unit 313 on the side of the RFU 120.

By executing the same decompression processing as in the first embodiment, the decoder 414 converts (decompresses) M-bit compressed data to N-bit sampled data, and outputs it.

As described above, according to this embodiment, it is possible to compress a baseband signal at a high compression ratio while suppressing degradation in signal quality along with compression processing, by adaptively controlling quantization thresholds to be used for data compression in accordance with the frequency distribution, similarly to the first embodiment.

The present invention is not limited to the above embodiments and various changes and modifications can be made without departing from the spirit and scope of the present invention. Therefore, to apprise the public of the scope of the present invention, the following claims are made.

The invention claimed is:

1. A base station system comprising a baseband unit and a radio frequency (RF) unit connected to the baseband unit via a communication line, the RF unit comprising:
   a generator that generates, as sampled data, a digital signal corresponding to a baseband signal to be transmitted to the baseband unit;
   a determiner that determines, based on a frequency distribution of amplitudes indicated by the sampled data generated by the generator, a plurality of thresholds which are used for quantization processing of each of the amplitudes; and
   a compressor that compresses the sampled data by the quantization processing using the plurality of thresholds determined by the determiner to generate compressed data to be transmitted to the baseband unit.

2. The base station system according to claim 1, wherein the determiner determines the plurality of thresholds so that, for each of a plurality of sections obtained by dividing, using the plurality of thresholds, a value range within which the amplitudes can fall, a width of the section becomes narrower as a frequency of occurrence of an amplitude included in the section is higher, and the width of the section becomes wider as the frequency of occurrence of the amplitude in the section is lower.

3. The base station system according to claim 1, wherein the determiner determines the plurality of thresholds so that integrated values of frequencies of occurrence of the amplitudes in respective ones of a plurality of sections obtained by dividing, using the plurality of thresholds, a value range within which the amplitudes can fall, become equal with respect to the plurality of sections.

4. The base station system according to claim 1, wherein the frequency distribution is approximated as a normal distribution determined by a mean and standard deviation of frequencies of occurrence of the amplitudes.

5. The base station system according to claim 4, wherein the determiner determines the plurality of thresholds based on a cumulative distribution function of the frequency distribution.

6. The base station system according to claim 5, wherein the determiner determines, as the plurality of thresholds to be used for the quantization processing, a plurality of amplitudes corresponding to a plurality of division thresholds for equally dividing a value range within which the cumulative distribution function can fall.

7. The base station system according to claim 1, wherein
   the RF unit further comprises a transmitter that transmits the compressed data to the baseband unit together with control information indicating the plurality of thresholds determined by the determiner, and
   the baseband unit comprises a decompressor that receives the control information and the compressed data transmitted by the transmitter, and decompresses the compressed data using the plurality of thresholds indicated by the control information.

8. The base station system according to claim 1, wherein
   the generator generates, as the sampled data, in-phase (I) channel data and quadrature (Q) channel data, and
   the determiner, and the compressor individually execute processing for each of the I channel data and the Q channel data.

9. The base station system according to claim 1, wherein the baseband unit and the RF unit are connected via an optical line.

10. The base station system according to claim 1, wherein the generator generates the sampled data by down-converting, to a baseband signal, an analog signal received via an antenna connected to the RF unit, and converting the baseband signal into a digital signal.

11. A base station system comprising a baseband unit and a radio frequency (RF) unit connected to the baseband unit via a communication line, the baseband unit comprising:
   a generator that generates, as sampled data, a digital signal corresponding to a baseband signal to be transmitted to the RF unit;
   a determiner that determines, based on a frequency distribution of amplitudes indicated by the sampled data generated by the generator, a plurality of thresholds which are used for quantization processing of each of the amplitudes; and
   a compressor that compresses the sampled data by the quantization processing using the plurality of thresholds determined by the determiner to generate compressed data to be transmitted to the RF unit.

12. A communication apparatus for communicating with an opposing apparatus connected via a communication line in a base station system, comprising:
   a generator that generates, as sampled data, a digital signal corresponding to a baseband signal to be transmitted to the opposing apparatus;
   a determiner that determines, based on a frequency distribution of amplitudes indicated by the sampled data generated by the generator, a plurality of thresholds which are used for quantization processing of each of the amplitudes; and a compressor that compresses the sampled data by the quantization processing using the plurality of thresholds determined by the determiner to generate compressed data to be transmitted to the opposing apparatus.

13. The communication apparatus according to claim 12, wherein
the communication apparatus is a radio frequency (RF) unit of the base station system, and
the opposing apparatus is a baseband unit of the base station system.

14. The communication apparatus according to claim 12, wherein
the communication apparatus is a baseband unit of the base station system, and
the opposing apparatus is a radio frequency (RF) unit of the base station system.

* * * * *